United States Patent [19]
Iwamoto

[11] Patent Number: 6,148,626
[45] Date of Patent: Nov. 21, 2000

[54] CHILLER APPARATUS

[75] Inventor: Kazuki Iwamoto, Yokohama, Japan

[73] Assignee: Innotech Corporation, Japan

[21] Appl. No.: 09/218,788

[22] Filed: Dec. 22, 1998

[30] Foreign Application Priority Data

Dec. 24, 1997 [JP] Japan .................................. 9-366417

[51] Int. Cl.[7] .............................. F25D 17/00; F24D 11/00
[52] U.S. Cl. ................................ 62/180; 62/185; 165/236
[58] Field of Search ............................ 62/180, 185, 201;
165/236, 104.31

[56] References Cited

U.S. PATENT DOCUMENTS 5,138,845  8/1992  Mannion et al. ...................... 62/185 X

*Primary Examiner*—William Wayner
*Attorney, Agent, or Firm*—Steinberg & Raskin, P.C.

[57] ABSTRACT

A chiller apparatus capable of increasing accuracy of temperature control without large-sizing a chiller, to thereby rapidly accommodate to a large variation in temperature of a load and being decreased in size thereof to increase a degree of freedom in selection of conditions under which the apparatus is installed. The chiller apparatus includes a primary circuit including a chiller and a pump for circulating a refrigerant through the primary circuit, a secondary circuit including a pump for circulating, through the secondary circuit, a refrigerant heat-exchanged with the refrigerant of the primary circuit, a buffer tank arranged at the secondary circuit, a load circuit including a pump for circulating a refrigerant through the load circuit to chill a load, and communication flow passages for connecting the secondary circuit and load circuit to each other therethrough. One of the communication flow passages is provided with a valve for controlling a refrigerant flowing through the communication flow passage. The load is provided with a first temperature detection mechanism for generating a load temperature signal. The valve has a degree of opening adjusted depending on the load temperature signal of the first temperature detection mechanism. The chiller apparatus also includes at least one temperature control mechanism for controlling a temperature of the load.

6 Claims, 3 Drawing Sheets

CHILLER APPARATUS

BACKGROUND OF THE INVENTION

This invention relates to a chiller apparatus, and more particularly to a chiller apparatus for cooling or chilling a load required to be chilled such as a semiconductor manufacturing equipment.

A chiller apparatus which has been conventionally known in the art is generally constructed in such a manner as shown in FIG. 4 by way of example. More specifically, the conventional chiller apparatus includes a cooler or chiller 1 for chilling a refrigerant circulated through a primary circuit 2. The thus-chilled refrigerant of the primary circuit 2 is heat-exchanged with a refrigerant of a load circuit 29, which then chills a load A such as a semiconductor manufacturing equipment.

The primary circuit 2 is provided with a pump $P_1$ and a primary buffer tank 4, so that the refrigerant of the primary circuit 2 may be circulated as indicated at an arrow 2' in FIG. 4. The load circuit 29 is likewise provided with a pump $P_2$ and a buffer tank 6, so that the refrigerant of the load circuit 29 chilled through the heat exchanger 3 may be circulated as indicated at an arrow 29'. Arrangement of the buffer tank 6 at the load circuit 29 as well is for the purpose of increasing the refrigerant on a side of the load circuit 29 by an amount corresponding to a volume of the buffer tank 6 to facilitate absorption of a variation in temperature of the load A or an increase in temperature thereof.

A temperature of the load A is feed-backed to the chiller 1 of the primary circuit 2. The chiller 1 is adapted to start operation or be increased in output when a temperature of the load A is increased to a level equal to or above a predetermined level. When the chiller 1 starts high-power operation, chilling is carried out in order of the refrigerant of the primary circuit 2, the refrigerant of the load circuit 29 and the load A.

Now, operation of the thus-constructed conventional chiller equipment carried out when a temperature of the load A is varied will be described with reference to FIGS. 4 and 5, wherein FIG. 5 shows a variation in temperature $T_1$ of the load A, temperature $T_2$ of the refrigerant of the load circuit 29 and temperature $T_3$ of the refrigerant of the primary circuit 2 with respect to time.

In FIG. 5, $X_0$ indicates a control target temperature of the load A. Initially, the temperature $T_1$ of the load A, the temperature $T_2$ of the refrigerant of the load circuit 29 and the temperature $T_3$ of the refrigerant of the primary circuit 2 are kept equilibrated at the control target temperature $X_0$. Then, when the temperature $T_1$ of the load A is rapidly increased at time $t_1$, the temperature $T_2$ of the refrigerant of the load circuit 29 is increased correspondingly. Whereas, the load circuit 29 is provided with the buffer tank 6 as described above, resulting in the refrigerant of the load circuit 29 being increased in total amount. This keeps the temperature $T_2$ of the refrigerant of the load circuit 29 from being increased in a manner similar to the temperature $T_1$ of the load A.

The temperature $T_1$ of the load A is then feed-backed to the chiller 1, so that the chiller 1 is increased in power when it detects an increase in temperature $T_1$ of the load A. An increase in power of the chiller 1 leads to a reduction in temperature $T_3$ of the refrigerant of the primary circuit 2, resulting in the temperature $T_2$ of the refrigerant of the load circuit 29 heat-exchanged with the refrigerant of the primary circuit 2 being likewise decreased. Such a reduction in temperature $T_2$ of the refrigerant of the load circuit 29 leads to a reduction in temperature $T_1$ of the load A.

Thus, operation of the chiller 1 leads to a reduction in temperature $T_3$ of the refrigerant of the primary circuit 2, temperature $T_2$ of the refrigerant of the load circuit 29 and temperature of $T_1$ of the load A in order. This causes much time to be taken from starting of operation of the chiller 1 to returning of the temperature $T_1$ of the load A to the target temperature $X_0$.

In particular, the conventional chiller apparatus is provided with the buffer tank 6 in order to rapidly absorb any temperature variation of the load A, to thereby increase the total amount of refrigerant of the load circuit 29, so that much time is required to decrease the temperature. This causes the apparatus to be deteriorated in responsibility of temperature control with respect to an increased variation in temperature or a large increase in temperature.

Such a deterioration in responsibility of the temperature control causes a failure in control of a temperature of the load A with increased accuracy. However, it is often required to control the load A with increased accuracy. This is required when the load A is, for example, a semiconductor manufacturing apparatus. In particularly, in film formation techniques such as CVD, PVD or the like, it is required to control a temperature of a substrate within a range of $\pm 5°$ C. in order to ensure formation of a uniform film.

However, the conventional chiller apparatus, as described above, is deteriorated in responsibility, to thereby fail to control a temperature of the load A within a range of, for example, $\pm 5°$ C. More specifically, it often carries out temperature control of the load beyond the allowable temperature range. Also, it often causes a failure to permit a temperature of the load A once exceeding the temperature range to be rapidly returned to the allowable temperature range. It is of course that departing of the temperature from the allowable temperature range over a long period of time causes a film formed to be nonuniform in quality.

In order to improve responsibility of the temperature control, it would be considered to carry out full-power operation of the chiller 1 to rapidly decrease a temperature of the refrigerator, to thereby chill the load A. However, in the conventional chiller apparatus, the amount of refrigerant of the load circuit 29 is significantly increased, so that a rapid decrease in temperature of the refrigerant is a burden to the chiller 1. This requires to incorporate a large-sized chiller into the chiller apparatus. Also, an increase in burden to the chiller 1 causes it to be deteriorated in durability. In addition, large-sizing of the chiller 1 leads to further disadvantages such as large-sizing of the whole chiller apparatus, a restriction of a place at which the chiller apparatus is to be installed, an increase in equipment cost and the like.

Also, when the temperature of the refrigerant of each of the primary circuit 2 and load circuit 29 is rapidly reduced, a decrease in temperature of load A is delayed from the decrease in refrigerant temperature. This, when the load temperature $T_1$ reaches the control target temperature $X_0$, often causes the temperature $T_2$ of the refrigerant of the load circuit 29 to be excessively decreased. In this instance, the temperature $T_1$ of the load is also caused to be decreased below the control target temperature $X_0$ subsequently to the decrease in temperature $T_1$. At this time, when the decrease in temperature $T_1$ exceeds the above-described allowable range of $\pm 5°$ C., a film formed is deteriorated in quality and uniformity.

The load temperature thus excessively decreased may be returned to the appropriate range by either interrupting operation of the chiller 1 or reducing the operation, to thereby increase the temperature.

For example, as shown in FIG. 5, supposing that the temperature $T_1$ of the load A is rapidly increased at time $t_1$ when the load is being driven while keeping thermal equilibrium, such an increase in temperature $T_1$ of the load A is immediately transmitted to the chiller 1. This results in the chiller 1 being increased in power with the increase in temperature. Thus, the temperature $T_3$ of the refrigerant of the primary circuit 3 is caused to be temporarily decreased, however, it is caused to be kept unvaried at certain time as shown in FIG. 5. This indicates that the chiller 1 has reached a limitation of full power operation thereof.

As described above, the temperature $T_2$ of the refrigerant of the load circuit 29 fails to be rapidly reduced irrespective of a decrease in temperature $T_3$ of the refrigerant of the primary circuit 2. Thus, the temperature $T_2$ of the refrigerant of the load circuit 29 starts to be decreased after the temperature $T_3$ of the refrigerant of the primary circuit 2 are decreased to a degree. Also, the temperature $T_1$ of the lead A starts to be decreased in a short period of time after the temperature T2 of starts to be decreased.

In any event, the conventional chiller apparatus causes misregistration in timings at which the temperatures $T_1$ to $T_3$ are decreased. More specifically, the temperature $T_3$ of the refrigerant of the primary circuit 2 is first decreased and then the temperature $T_2$ of the refrigerant of the load circuit 29 is decreased, followed by decrease in temperature $T_1$ of the load A.

In addition to such misregistration in timings, the conventional chiller apparatus causes another problem of excessively chilling the load A because the chiller 1 is operated on the basis of the temperature $T_1$ of the load A. Even when operation of the chiller 1 is suddenly interrupted in the case that the load A is excessively chilled, the conventional chiller apparatus fails to rapidly return the temperature of the load A to the control target temperature because the load circuit 29 is deteriorated in responsibility due to an increase in total amount of the refrigerant.

Further, when the chiller 1 is kept decreased in power in excess of a required period of time, the temperature $T_1$ of the load A is caused to be excessively increased. In this instance, unless the chiller 1 is considerably accurately operated, convergence of the temperature control is deteriorated as shown in FIG. 5.

SUMMARY OF THE INVENTION

The present invention has been made in view of the foregoing disadvantage of the prior art.

Accordingly, it is an object of the present invention to provide a chiller apparatus which is capable of attaining temperature control of a load with increased accuracy while eliminating a necessity of large-sizing a chiller.

It is another object of the present invention to provide a chiller apparatus which is capable of rapidly accommodating to an increase in temperature variation of a load.

It is a further object of the present invention to provide a chiller apparatus which is capable of attaining both small-sizing of the whole apparatus and an increase in degree of freedom of installation conditions.

In accordance with the present invention, a chiller apparatus is provided. The chiller apparatus includes a primary circuit including a chiller and a pump for circulating a refrigerant through the primary circuit, a secondary circuit including a pump for circulating, through the secondary circuit, a refrigerant heat-exchanged with the refrigerant of the primary circuit, a buffer tank arranged at the secondary circuit, at least one load circuit including a pump for circulating a refrigerant through the load circuit to chill a load, and communication flow passages for connecting the secondary circuit and load circuit to each other therethrough. One of the communication flow passages is provided with a valve for controlling a refrigerant flowing through the communication flow passage. The load is provided with a first temperature detection mechanism for generating a load temperature signal. The valve has a degree of opening adjusted depending on the load temperature signal of the first temperature detection mechanism. The chiller apparatus further includes at least one temperature control mechanism for controlling a temperature of the load.

In a preferred embodiment of the present invention, the chiller apparatus further includes a second temperature detection mechanism for detecting a temperature of the refrigerant of the secondary circuit. The second temperature detection mechanism generates a first refrigerant temperature signal indicating the temperature of the refrigerant of the secondary circuit. The refrigerant temperature signal is feed-backed to the primary circuit to control operation of the chiller of the primary circuit. The temperature of the refrigerant of the secondary circuit is constantly kept at a level below a control target temperature of the load.

In a preferred embodiment of the present invention, the chiller apparatus further includes a third temperature detection mechanism for detecting a temperature of the refrigerant of the load circuit. The third temperature detection mechanism is constructed so as to generate a second refrigerant temperature signal indicating the temperature of the refrigerant of the load circuit. The third temperature control mechanism functions to control the degree of opening of the valve depending on the second refrigerant temperature signal of the third temperature control mechanism.

In a preferred embodiment of the present invention, the temperature control mechanism is stored therein with a table indicating a variation in temperature of the refrigerant of the load circuit corresponding to a variation in temperature of the load, so that the degree of opening of the valve is adjusted on the basis of the table when the temperature of the load is varied, to thereby control the temperature of the refrigerant of the load circuit.

In a preferred embodiment of the present invention, the communication flow passages are connected to the buffer tank.

In a preferred embodiment of the present invention, the load circuits each are provided with a heater.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, a chiller apparatus according to the present invention will be described hereinafter with reference to FIGS. 1 to 3.

Figure 1:
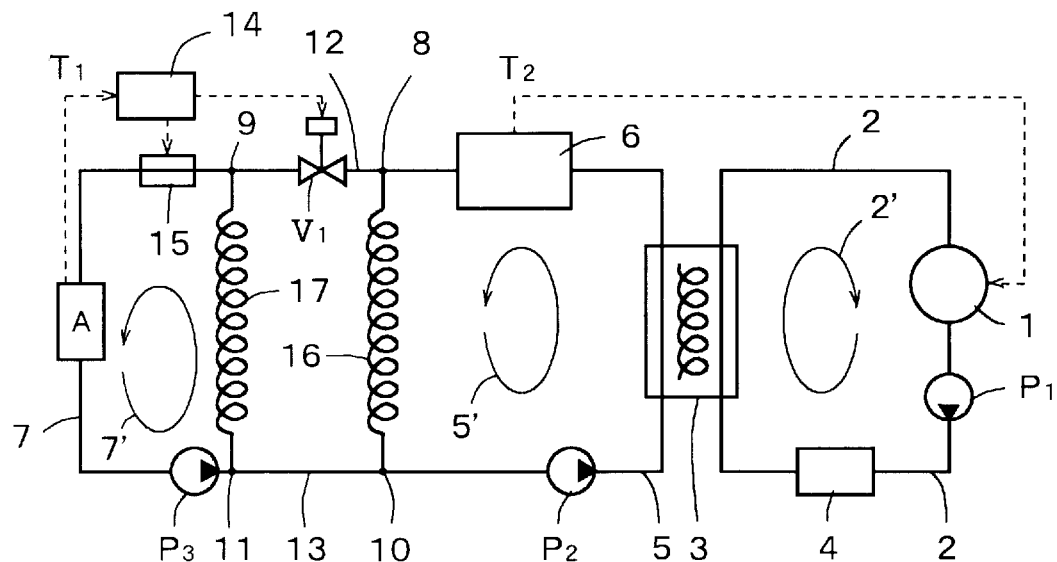
FIG. 1 is a circuit diagram showing a first embodiment of a chiller apparatus according to the present invention.
Figure 4:
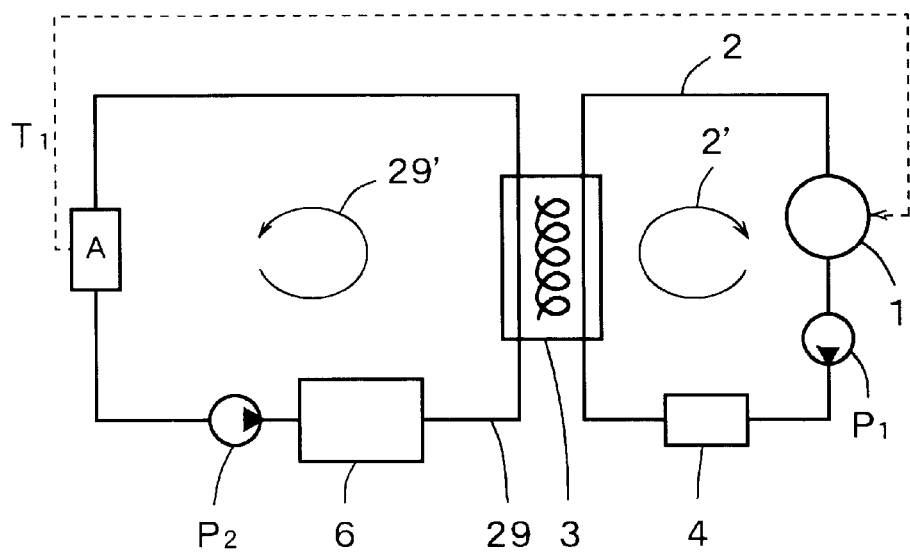
FIG. 4 is a circuit diagram showing a conventional chiller apparatus by way of example.
Figure 5:
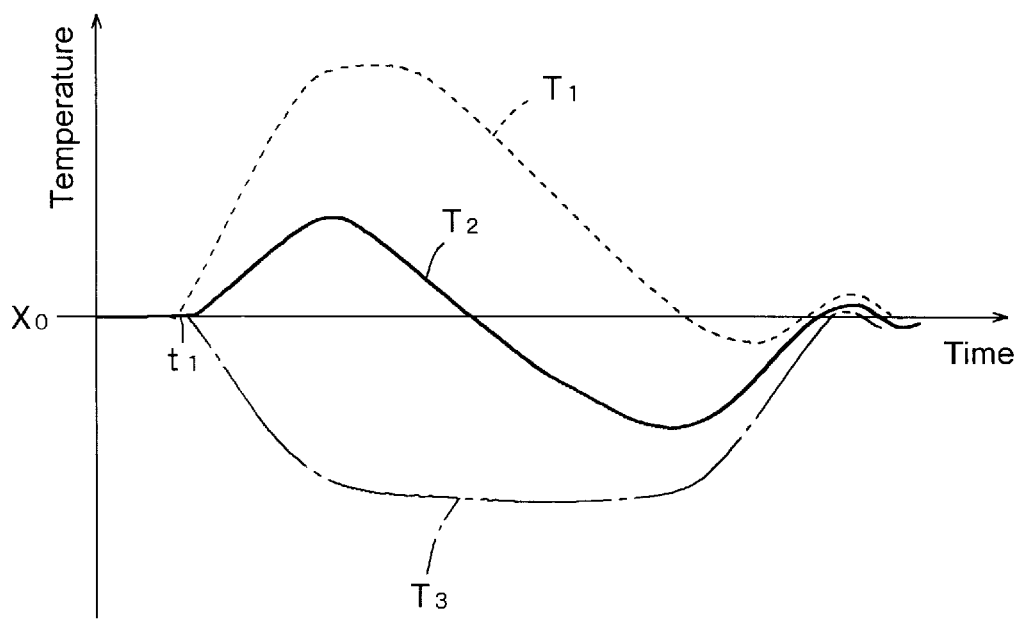
FIG. 5 is a graphical representation showing a variation in temperature in a conventional chiller apparatus.

Referring first to FIG. 1, a first embodiment of a chiller apparatus according to the present invention is illustrated. A chiller apparatus of the illustrated embodiment includes a primary circuit 2 constructed in substantially the same manner as that of the conventional chiller apparatus described above with reference to FIG. 4. The primary circuit 2 includes a chiller 1 for chilling a refrigerant of the primary circuit 2 and a pump $P_1$ for forcibly circulating the thus-chilled refrigerant through the primary circuit 2.

The chiller apparatus of the illustrated embodiment also includes a secondary circuit 5 through which a refrigerant subjecting to heat exchange with the refrigerant of the primary circuit 2 through a heat exchanger 3 is circulated, as well as a load circuit 7 through which a refrigerant for directly chilling a load A is circulated. The secondary circuit 5 has a pump $P_2$ and a buffer tank 6 arranged thereon and is provided with a resistance section 16 exhibiting a flow resistance increased as compared with the remaining part of the secondary circuit 5.

The chiller 1 is so operated that a refrigerant in the buffer tank 6 is kept at a temperature $T_2$ constantly set at a level reduced by 10 to 50° C. as compared with a control target temperature of the load A.

The load circuit 7 has a pump P3 for forcibly circulating the refrigerant of the load circuit 7 and is provided with a resistance section 17 having a flow resistant increased as compared with that of the remaining part of the load circuit 7. Also, the load circuit 7 is provided with a heater 15 which functions to heat the refrigerant of the load circuit 7 when the refrigerant of the load circuit 7 is excessively reduced in temperature and/or the load A is desired to be heated to a temperature above a room temperature.

Also, the chiller apparatus of the illustrated embodiment includes communication flow passages 12 and 13 arranged between the secondary circuit 5 and the load circuit 7 so as to permit the circuits 5 and 7 to communicate with each other there-through as required. The communication flow passage 12 is arranged so as to be connected between a junction 8 provided at one end of the resistance section 16 of the secondary circuit 5 and a junction 9 provided at one end of the resistance section 17 of the load circuit 7, of which an intermediate portion is mounted thereon with a flow control valve $V_1$. The communication flow passage 13 is arranged so as to be connected between a junction 10 provided at the other end of the resistance section 16 and a junction 11 provided at the other end of the resistance section 17.

When the valve $V_1$ is kept closed, the communication flow passage 12 is kept interrupted, so that both secondary circuit 5 and load circuit 7 each form a closed system. The refrigerants of the secondary circuit 5 and load circuit 7 are circulated in the flow passages 5 and 7 as indicated at arrows 5' and 7' in FIG. 1, respectively, so that the refrigerants are kept from flowing through the communication flow passages 12 and 13.

Then, when the valve $V_1$ is rendered open, the refrigerant of the secondary circuit 5 is permitted to flow through the communication flow passage 12 to the load circuit 7. This results in the refrigerant of the load circuit 7 in the same amount as the refrigerant flowing through the communication flow passage 12 being returned through the communication flow passage 13 to the secondary circuit 5. At this time, the amount of refrigerant flowing through each of the communication flow passages 12 and 13 depends on a degree of opening of the valve $V_1$.

Further, the chiller apparatus of the illustrated embodiment includes a temperature controller 14 acting as a temperature adjusting mechanism. The temperature controller 14 functions to control a degree of opening of the valve $V_1$ and/or the heater 15 depending on a temperature of the load A.

The chiller apparatus of the illustrated embodiment is constructed so as to separate the load circuit 7 and secondary circuit 5 from each other to reduce a temperature of the refrigerant of the secondary circuit 5. The refrigerant of the load circuit 7 is mixed with the refrigerant of the secondary circuit 5, to thereby be cooled; so that the refrigerant of the load circuit 7 may be merely required in only an amount circulated therethrough, because a refrigerant which absorbs an increase in temperature of the load A is not limited to only the refrigerant of the load circuit 7.

Now, the manner of temperature control of the load A will be described hereinafter.

When the valve $V_1$ is kept closed, the refrigerant of the secondary circuit 5 and that of the load circuit 7 are circulated separately from each other while being kept from being mixed with each other. Then, when a temperature of the load A is increased and the temperature controller detects such an increase in temperature of the load A, the temperature controller 14 opens the valve $V_1$ to permit the secondary circuit 5 and load circuit 7 to communicate with each other through the communication flow passage 12.

Opening of the valve $V_1$ results in the refrigerant of the secondary circuit 5 flowing through the ramification 8 of the secondary circuit 5, the communication flow passage 12 and the ramification 9 of the load circuit 7 to the load circuit 7, to thereby be mixed with the refrigerant of the load circuit 7. Then, the refrigerant of the load circuit 7 is returned in an amount corresponding to that of the refrigerant flowing through the communication flow passage 12 to the load circuit 7 through the ramification 11 of the load circuit 7, the communication flow passage 13 and the ramification 10 of the secondary circuit 5 to the secondary circuit 5.

A temperature of the refrigerant fed from the secondary circuit 5 to the load circuit 7 is kept at a level reduced by 10 to 50° C. as compared with the control target temperature of the load A. Also, the load circuit 7 for directly chilling the load A is separated from the secondary circuit 5, to thereby permit the amount of refrigerant circulated therethrough to be reduced. This permits a temperature of the refrigerant of the load circuit 7 to be rapidly reduced while reducing the amount of refrigerant of the secondary circuit 5 fed to the load circuit 7. This means that a temperature of the load A can be rapidly reduced.

The amount of refrigerant flowing through the communication flow passage 12 depends on a degree of opening of the valve $V_1$. When a temperature of the load A is substantially increased, a degree of opening of the valve $V_1$ is increased, to thereby increase the amount of refrigerant of the secondary circuit 5 fed through the communication flow passage 12 to the load circuit 7, resulting in the load A being rapidly chilled. On the contrary, when an increase in temperature of the load A is reduced, a degree of opening of the valve $V_1$ is reduced, to thereby decrease the amount of refrigerant fed from the secondary circuit 5 to the load circuit 7, resulting in preventing the load A from being excessively chilled. Such controlling of the amount of refrigerant flowing through the communication flow passage 12 permits a temperature of the refrigerant of the load circuit 7 to be controlled with high accuracy.

When it is desired to interrupt chilling of the load A, the valve $V_1$ is closed, to thereby close the communication flow passage 12, so that the load A may be naturally increased in temperature. When a rapid increase in temperature of the load A or an increase in temperature of the load to a level of a room temperature or more for the subsequent step is desired, the refrigerant of the load A is heated by means of the heater 15. In this instance as well, the temperature controller 14 controls a switch of the heater 15 depending on a temperature of the load.

Thus, when the load A is left to stand at a room temperature or the heater 15 is used, the valve $V_1$ is kept closed, so that it is merely required to heat a small amount of refrigerant circulated through the load circuit 7. Thus, the chiller apparatus of the illustrated embodiment exhibits satisfactory control responsibility also when the load A is heated. Also, the refrigerant of the secondary circuit 5 is circulated through the closed system while being kept from being heated by the heater 15 and a temperature $T_2$ of the refrigerant of the secondary circuit 5 is constantly kept at a level reduced by 10 to 50° C. as compared with the control target temperature of the load A. This permits the chiller apparatus of the illustrated embodiment to rapidly accommodate to the next chilling procedure as required.

The resistance section 16 provided on the secondary circuit 5 is arranged so as to permit the refrigerant circulated through the secondary circuit 5 when the valve $V_1$ is rendered open to readily flow through the connection flow passage 12 to the load circuit 7. When the secondary circuit 5 is decreased in flow resistance as compared with that of the communication flow passage 12, the refrigerant of the secondary circuit 5 is caused to be still circulated as indicated at the arrow 5', to thereby fail to be fed to the load circuit 7 and mixed with the refrigerant of the load circuit 7. The resistance section 16 functions to eliminate such a disadvantage.

The resistance section 17 of the load circuit 7 exhibits a like function. Thus, the resistance section 17 facilitates interchange between the refrigerant of the secondary circuit 5 and that of the load circuit 7.

Alternatively, the secondary circuit 5 and load circuit 7 each inherently have a flow resistance, so that arrangement of such resistance sections 16 and 17 may be eliminated so long as the flow resistances are balanced to permit the refrigerants to be satisfactorily mixed with each other when the valve $V_1$ is open.

The chiller apparatus of the illustrated embodiment is so constructed that the refrigerant of the secondary circuit 5 provided with the buffer tank 6 is kept from directly chilling the load A. Such construction permits a temperature of the refrigerant of the secondary circuit 5 to be kept at a level below the control target temperature of the load A. On the contrary, in the prior art described above, the refrigerant of the load circuit 29 is heat-exchanged directly with the refrigerant of the primary circuit 2, so that it is not possible to readily reduce a temperature of the refrigerant of the load circuit 29 to a level below the control target temperature of the load A.

Also, the chiller apparatus of the illustrated embodiment permits the refrigerant of the load circuit 7 to be reduced in amount, so that mixing of the refrigerant of the secondary circuit 5 kept at a low temperature with the refrigerant of the load circuit 7 satisfactorily chills the load A while ensuring good responsibility of the chiller apparatus.

Further, a reduction in temperature of the refrigerant of the secondary circuit 5 permits a decrease in total amount of the refrigerant required. When it is desired to feed the refrigerant of the secondary circuit 5 to the load circuit 7 to chill the refrigerant of the load circuit 7, such a reduction in temperature of the refrigerant of secondary circuit 5 leads to a reduction in the amount of refrigerant to be fed to the load circuit 7. This permits the buffer tank 7 to be small-sized as compared with the conventional chiller apparatus.

In addition, the chiller apparatus of the illustrated embodiment may be constructed so as to operate the chiller 1 in spite of an increase in temperature of the load A or a variation of the temperature, to thereby previously reduce a temperature of the refrigerant of the secondary circuit 5. This eliminates large-sizing of the chiller, which is required in the conventional chiller apparatus wherein the load is rapidly chilled after an increase in temperature of the load. Such small-sizing of the buffer tank 6 and chiller 1 leads to a reduction in cost of the chiller apparatus and small-sizing thereof.

Chilling of a semiconductor manufacturing equipment often requires to install the whole chiller apparatus in a clean room. Thus, small-sizing of the apparatus permits small-sizing of the clean room, leading to cost savings.

Figure 2:
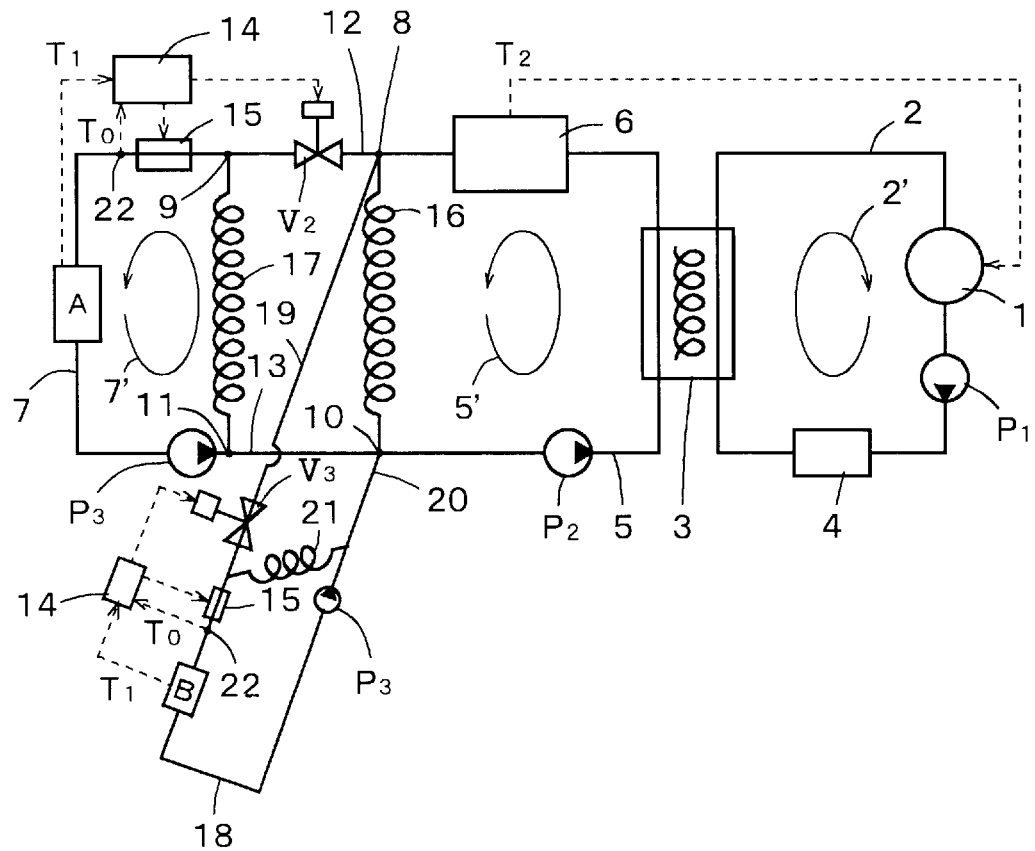
FIG. 2 is a circuit diagram showing a second embodiment of a chiller apparatus according to the present invention.

Referring now to FIG. 2, a second embodiment of a chiller apparatus according to the present invention is illustrated. A chiller apparatus of the second embodiment is so constructed that a load circuit 7 for controlling a temperature of a load A and an additional load circuit 18 for controlling a temperature of an additional load B are arranged so as to control a temperature of both loads A and B. In FIG. 2, reference numeral 21 designates a resistance section of the additional load circuit 18, which is connected through communication flow passages 19 and 20 to ramifications 8 and 10 of a secondary circuit 5, respectively. A communication flow passage 12 and the communication flow passage 19 are provided with on-off valves $V_2$ and $V_3$, respectively.

The remaining part of the second embodiment may be constructed in substantially the same manner as the first embodiment described above.

In the illustrated embodiment, a load circuit 7 and the load circuit 18 are constructed in substantially the same manner. Thus, the following description will be made in connection with the load circuit 7. The load circuit 7 includes a pump P3 for circulating a refrigerant through the load circuit 7, a heater 15, a thermometer 22 for detecting a temperature To of the refrigerant of the load circuit 7. The temperature To and a temperature $T_1$ of the load A are inputted to a temperature controller 14.

The temperature controller 14 is stored therein with a table which indicates a variation $\Delta T_0$ of the temperature $T_0$ of the refrigerant of the load circuit 7 which must be reduced with respect to a variation $\Delta T_1$ of the temperature $T_1$ of the load A when the temperature $T_1$ is increased. Operation of the valve $V_2$ is carried out depending on the table.

For example, when the load temperature $T_1$ is increased by $\Delta T_1$, the valve $V_2$ is rendered open to permit the refrigerant of the secondary circuit 5 to be mixed with the refrigerant of the load circuit 7 through the communication flow passage 12. At this time, the amount of refrigerant flowing through the communication flow passage 12 is rendered constant by opening the valve $V_2$. The refrigerant of the load circuit 7 in an amount equal to the amount of refrigerant of the secondary circuit 5 flowing through the flow passage 12 to the load circuit 7 is returned through a communication flow passage 13 to the secondary circuit 5. Feed of the refrigerant of the secondary circuit 5 to the load circuit 7 leads to a reduction in temperature $T_0$ of the refrigerant of the load circuit 7. When the temperature $T_0$ is reduced by the amount of $\Delta T_0$ determined by the table described above, the temperature controller 14 closes the valve $V_2$ to interrupt the communication flow passage 12. This permits a temperature of the load A to be kept at a level of the control target temperature.

A temperature controller 14 provided at the load circuit 18 likewise controls a temperature of the load B in substantially the same manner.

Such standardized control using the table permits the temperature controller 14 to be simplified in structure.

In the illustrated embodiment, the load circuits 7 and 18 are arranged so as to chill the loads A and B, respectively. Alternatively, the illustrated embodiment may be so constructed that the load circuits may be arranged while commonly using the secondary circuit 5 provided with a buffer tank 6, to thereby chill more loads. Also, the load circuits 7 and 18 each are provided with the temperature controller 14, so that temperature control may be individually carried out depending on the loads.

Thus, the illustrated embodiment leads to small-sizing of the whole chiller apparatus as compared with the prior art which requires arrangement of the load circuits 29 each including the buffer tank and the primary circuits corresponding in number to the loads.

In the illustrated embodiment, the on-off valves $V_2$ and $V_3$ respectively provided at the communication flow passage 12 and 19 each do not function to adjust a degree of opening thereof to control a flow rate of the refrigerant, so that a period of time during which each of the valves $V_2$ and $V_3$ is kept open is varied depending on a variation in temperature $T_1$ of the load. The valves $V_2$ and $V_3$ may be replaced with the flow control valve $V_1$ incorporated in the first embodiment described above.

Also, the illustrated embodiment may be constructed so as to control operation of the valves $V_2$ and $V_3$ based on the temperature $T_1$ of the load A without detecting a temperature of the refrigerant of the secondary circuit 5. In this instance, detection of the temperature To of the refrigerant of the secondary circuit 5 as well ensures that the temperature $T_1$ of the load A varied somewhat behind the temperature To of the refrigerant is estimated to more delicately attain the control.

The second embodiment likewise permits a temperature of the load A to be controlled with increased responsibility using the refrigerant of the secondary circuit 5 constantly kept at a level below the control target temperature of the load A.

Figure 3:
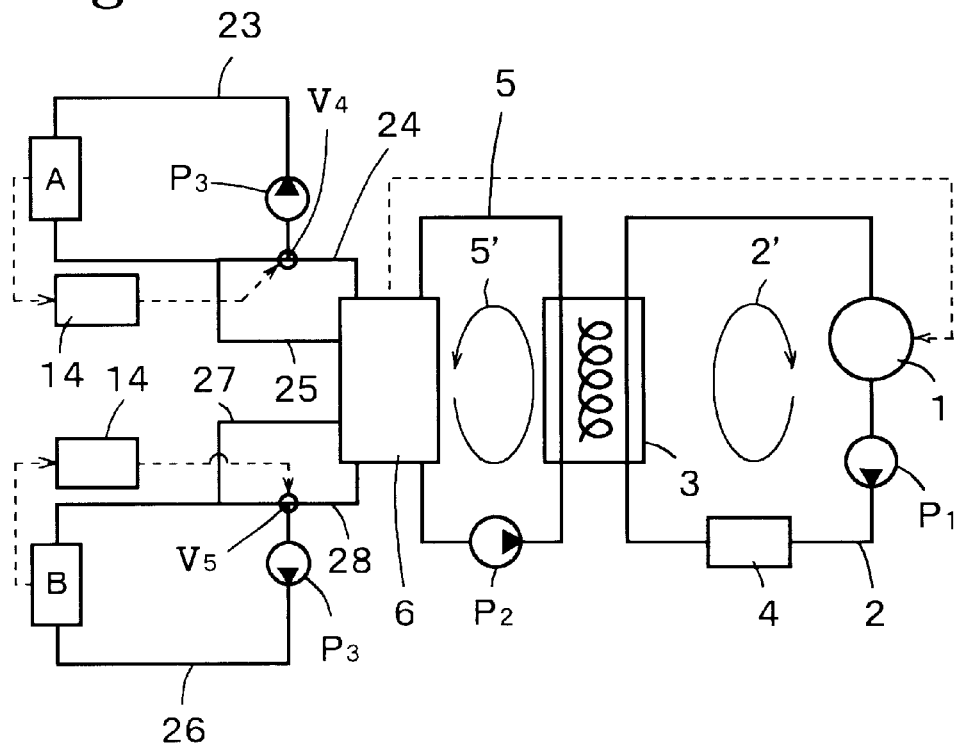
FIG. 3 is a circuit diagram showing a third embodiment of a chiller apparatus according to the present invention.

Referring now to FIG. 3, a third embodiment of a chiller apparatus according to the present invention is illustrated. A chiller apparatus of the illustrated embodiment is constructed in substantially the same manner as the first embodiment described above with reference to FIG. 1, except that communication flow passages 24 and 25 are connected to a buffer tank 6 of a secondary circuit 5, to thereby permit a load circuit 23 to chill a load A through the communication flow passages 24 and 25. Like the load circuit 23, a load circuit 26 for chilling a load B is connected through communication flow passages 27 and 28 to a buffer tank 6.

The communication flow passages 24 and 28 are provided with flow control valves $V_4$ and $V_5$, respectively, of which a degree of opening is adjusted through temperature controllers 14. The amount of refrigerant of the secondary circuit 5 fed through the communication flow passages 24 and 28 to the load A is controlled depending on a degree of opening of the flow control valves $V_4$ and $V_5$.

The illustrated embodiment may attain temperature control of a plurality of loads using the common secondary circuit 5, like the second embodiment described above with reference to FIG. 2. Also, it may exhibit increased responsibility and contributes to small-sizing of the chiller apparatus, like the above-described embodiments. Further, in the illustrated embodiment, the communication flow passages 24 and 28 are connected to the buffer tank 6, to thereby facilitate connection of the communication flow passages.

In each of the first to third embodiments described above, the valves $V_1$ to $V_5$ each are arranged at the communication passage through which the refrigerant of the second circuit is fed to the load circuit. Alternatively, the valves each may be arranged at either the communication flow passage through which the refrigerant of the load circuit is returned to the secondary circuit or each of both communication flow passages.

As can be seen from the foregoing, the chiller apparatus of the present invention permits the secondary circuit and load circuit to be separated from each other through the valve, so that the refrigerant of the secondary circuit may be chilled to a degree sufficient to be kept at a low temperature in spite of a variation in temperature of the load circuit.

Also, the present invention ensures that the amount of refrigerant circulated through the load circuit is decreased, so that introduction of a refrigerant at a low temperature to the load circuit attains rapid chilling of the refrigerant of the load circuit, resulting in controlling a temperature of the load with increased responsibility.

In addition, a reduction in temperature of the refrigerant of the secondary circuit leads to a reduction in total amount of the refrigerant. Thus, the present invention contributes to small-sizing of the buffer tank and therefore the chiller apparatus.

In the present invention, the chiller may be driven in spite of an increase in temperature of the load, to thereby previously chill the refrigerant of the secondary circuit. Chilling of the refrigerant after an increase in temperature of the load as in the prior art requires to large-size the chiller. The present invention eliminates such a disadvantage. In general, in such a chiller apparatus, a chiller accounts for a large part of manufacturing cost of the apparatus, so that small-sizing of the chiller significantly contributes to cost-savings of the chiller apparatus.

Further, the present invention permits the single buffer tank-equipped secondary circuit to be arranged in common to a plurality of load circuits and therefore a plurality of loads, leading to further down-sizing of the apparatus and cost-savings thereof.

Thus, it will be noted that such small-sizing of the whole apparatus increases a degree of freedom in selection of conditions under which the chiller apparatus is installed.

This is particularly advantageous when the chiller apparatus of the present invention is applied to chilling of a semiconductor manufacturing equipment which must be wholly arranged in a clean room. The present invention contributes to small-sizing of the clean room, leading to cost-savings.

Furthermore, the present invention permits a temperature of the refrigerant of the secondary circuit to be kept at a level below the control target temperature of the load, to thereby rapidly accommodate to a substantial increase in temperature of the load.

Moreover, the present invention permits temperature control of the load to be attained with increased accuracy based on a temperature of the load and a temperature of the refrigerant of the load circuit.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A chiller apparatus comprising:

a primary circuit including a chiller and a pump for circulating a refrigerant through said primary circuit;

a secondary circuit including a pump for circulating, through said secondary circuit, a refrigerant heat-exchanged with the refrigerant of said primary circuit;

a buffer tank arranged at said secondary circuit;

at least one load circuit including a pump for circulating a refrigerant thorough said load circuit to chill a load;

communication flow passages for connecting said secondary circuit and said load circuit to each other therethrough;

one of said communication flow passages being provided with a valve for controlling a refrigerant flowing through the communication flow passage;

said load being provided with a first temperature detection mechanism for generating a load temperature signal;

at least one temperature control mechanism for receiving said load temperature signal and controlling a degree of opening of said valve based on said load temperature signal to thereby control a temperature of said load.

2. A chiller apparatus as defined in claim 1, further comprising a second temperature detection mechanism for detecting a temperature of the refrigerant of said secondary circuit;

said second temperature detection mechanism generating a first refrigerant temperature signal indicating the temperature of the refrigerant of said secondary circuit, said refrigerant temperature signal being feed-backed to said primary circuit to control operation of said chiller of said primary circuit;

the temperature of the refrigerant of said secondary circuit being constantly kept at a level below a control target temperature of said load.

3. A chiller apparatus as defined in claim 1, further comprising a third temperature detection mechanism for detecting a temperature of the refrigerant of said load circuit;

said third temperature detection mechanism generating a second refrigerant temperature signal indicating the temperature of the refrigerant of said load circuit;

said temperature control mechanism controlling the degree of opening of said valve depending on said second refrigerant temperature signal of said third temperature control mechanism.

4. A chiller apparatus as defined in claim 3, wherein said temperature control mechanism is stored therein with a table indicating a variation in temperature of the refrigerant of said load circuit corresponding to a variation in temperature of the load, so that the degree of opening of said valve is adjusted on the basis of the table when the temperature of said load is varied, to thereby control the temperature of the refrigerant of said load circuit.

5. A chiller apparatus as defined in any one of claims 1, wherein said communication flow passages are connected to said buffer tank.

6. A chiller apparatus as defined in claim 1, wherein said load circuits each are provided with a heater.

* * * * *